United States Patent
Reid et al.

(10) Patent No.: US 8,168,540 B1
(45) Date of Patent: May 1, 2012

(54) METHODS AND APPARATUS FOR DEPOSITING COPPER ON TUNGSTEN

(75) Inventors: Jonathan Reid, Sherwood, OR (US); Sesha Varadarajan, Tualatin, OR (US); Ugur Emekli, New York, NY (US)

(73) Assignee: Novellus Systems, Inc., San Jose, CA (US)

( * ) Notice: Subject to any disclaimer, the term of this patent is extended or adjusted under 35 U.S.C. 154(b) by 185 days.

(21) Appl. No.: 12/649,237

(22) Filed: Dec. 29, 2009

(51) Int. Cl.
H01L 21/44 (2006.01)

(52) U.S. Cl. ............... 438/687; 438/685; 438/686

(58) Field of Classification Search ............ 257/753, 257/E23.011, E21.584, E21.597; 438/685–687, 438/618, 652, 69
See application file for complete search history.

(56) References Cited

U.S. PATENT DOCUMENTS

| | | |
|---|---|---|
| 3,183,176 A | 5/1965 | Schwartz |
| 3,313,715 A | 4/1967 | Schwartz |
| 3,393,134 A | 7/1968 | Schwartz |
| 3,619,383 A | 11/1971 | Eisner |
| 3,619,384 A | 11/1971 | Eisner |
| 3,661,752 A | 5/1972 | Capper et al. |
| 3,749,652 A | 7/1973 | Eisner |
| 3,751,343 A | 8/1973 | Macula et al. |
| 3,849,270 A | 11/1974 | Takagi et al. |
| 3,904,489 A | 9/1975 | Johnson |
| 4,119,499 A | 10/1978 | Eidschun, Jr. |
| 4,227,986 A | 10/1980 | Loqvist et al. |
| 4,363,711 A | 12/1982 | Kuehnle |
| 4,452,684 A | 6/1984 | Palnik |
| 4,592,808 A | 6/1986 | Doubt |
| 4,738,756 A | 4/1988 | Mseitif |
| 5,034,753 A | 7/1991 | Weber |
| 5,096,550 A | 3/1992 | Mayer et al. |
| 5,158,860 A | 10/1992 | Gulla et al. |
| 5,169,514 A | 12/1992 | Hendriks et al. |
| 5,203,955 A | 4/1993 | Viehbeck et al. |
| 5,256,565 A | 10/1993 | Bernhardt et al. |
| 5,277,785 A | 1/1994 | Van Anglen |
| 5,378,346 A | 1/1995 | Ashiru et al. |
| 5,453,174 A | 9/1995 | Van Anglen et al. |
| 5,462,649 A | 10/1995 | Keeney et al. |
| 5,486,234 A | 1/1996 | Contolini et al. |
| 5,557,027 A | 9/1996 | Kemp |
| 5,807,165 A | 9/1998 | Uzoh et al. |
| 5,843,296 A | 12/1998 | Greenspan |
| 6,056,864 A | 5/2000 | Cheung |
| 6,056,869 A | 5/2000 | Uzoh |
| 6,083,835 A | 7/2000 | Shue et al. |
| 6,103,628 A | 8/2000 | Talieh |
| 6,121,152 A | 9/2000 | Adams et al. |
| 6,143,155 A | 11/2000 | Adams et al. |

(Continued)

OTHER PUBLICATIONS

Contolini, et al., "Electrochemical Planarization for Multilevel Metallization", Lawrence Livermore National Laboratory, J. Electrochem Soc., vol. 141, No. 9, Sep. 1994, pp. 2502-2510.

(Continued)

*Primary Examiner* — Thao Le
*Assistant Examiner* — Sheng Zhu
(74) *Attorney, Agent, or Firm* — Weaver Austin Villeneuve & Sampson LLP

(57) ABSTRACT

Apparatus and methods for depositing copper on tungsten are presented. The invention finds particular use in the semiconductor industry for depositing copper seed layers onto fields or through silicon vias having tungsten barrier layers, both reducing cost and complexity of existing methods.

30 Claims, 8 Drawing Sheets

U.S. PATENT DOCUMENTS

| | | | |
|---|---|---|---|
| 6,152,586 | A | 11/2000 | Dealey, Jr. et al. |
| 6,153,521 | A | 11/2000 | Cheung et al. |
| 6,171,467 | B1 | 1/2001 | Weihs et al. |
| 6,176,992 | B1 | 1/2001 | Talieh |
| 6,207,572 | B1 | 3/2001 | Talieh et al. |
| 6,251,235 | B1 | 6/2001 | Talieh et al. |
| 6,315,883 | B1 | 11/2001 | Mayer et al. |
| 6,328,872 | B1 | 12/2001 | Talieh et al. |
| 6,344,129 | B1 | 2/2002 | Rodbell et al. |
| 6,368,966 | B1 * | 4/2002 | Krishnamoorthy et al. .. 438/687 |
| 6,409,904 | B1 | 6/2002 | Uzoh et al. |
| 6,413,338 | B1 | 7/2002 | DiPalma |
| 6,447,668 | B1 | 9/2002 | Wang |
| 6,478,936 | B1 | 11/2002 | Volodarsky et al. |
| 6,482,307 | B2 | 11/2002 | Ashjaee et al. |
| 6,527,920 | B1 | 3/2003 | Mayer |
| 6,534,116 | B2 | 3/2003 | Basol |
| 6,592,742 | B2 | 7/2003 | Sun et al. |
| 6,630,059 | B1 | 10/2003 | Uzoh et al. |
| 6,638,411 | B1 | 10/2003 | Mishima et al. |
| 6,653,226 | B1 | 11/2003 | Reid |
| 6,709,565 | B2 | 3/2004 | Mayer et al. |
| 6,755,954 | B2 | 6/2004 | Mayer et al. |
| 6,756,307 | B1 | 6/2004 | Kelly et al. |
| 6,766,817 | B2 | 7/2004 | da Silva |
| 6,793,796 | B2 | 9/2004 | Reid et al. |
| 6,797,132 | B2 | 9/2004 | Talieh et al. |
| 6,811,675 | B2 * | 11/2004 | Chen ............................. 205/291 |
| 6,815,354 | B2 | 11/2004 | Uzoh et al. |
| 6,858,121 | B2 | 2/2005 | Basol |
| 6,863,795 | B2 | 3/2005 | Teerlinck et al. |
| 6,867,136 | B2 | 3/2005 | Basol et al. |
| 6,902,659 | B2 | 6/2005 | Talieh |
| 6,918,404 | B2 | 7/2005 | Dias da Silva |
| 6,919,010 | B1 | 7/2005 | Mayer |
| 6,921,551 | B2 | 7/2005 | Basol |
| 6,946,066 | B2 | 9/2005 | Basol et al. |
| 7,066,586 | B2 | 6/2006 | da Silva |
| 7,129,165 | B2 | 10/2006 | Basol et al. |
| 7,189,146 | B2 * | 3/2007 | Basol et al. ..................... 451/41 |
| 7,189,647 | B2 | 3/2007 | Patton et al. |
| 7,214,305 | B2 | 5/2007 | Matsuda et al. |
| 7,221,056 | B2 * | 5/2007 | Yamamoto et al. ........... 257/763 |
| 7,244,398 | B2 | 7/2007 | Kotary et al. |
| 7,285,255 | B2 | 10/2007 | Kadlee et al. |
| 7,341,946 | B2 * | 3/2008 | Kailasam et al. ............. 438/687 |
| 7,405,163 | B1 | 7/2008 | Drewery et al. |
| 7,449,098 | B1 | 11/2008 | Mayer et al. |
| 7,531,079 | B1 | 5/2009 | Mayer et al. |
| 7,799,200 | B1 | 9/2010 | Mayer et al. |
| 2001/0006224 | A1 | 7/2001 | Tsuchiya et al. |
| 2001/0013472 | A1 | 8/2001 | Nakamura et al. |
| 2002/0066673 | A1 | 6/2002 | Rodbell et al. |
| 2003/0111354 | A1 | 6/2003 | Hara et al. |
| 2004/0226827 | A1 | 11/2004 | Matsuda et al. |
| 2005/0145484 | A1 | 7/2005 | Basol |
| 2005/0258046 | A1 | 11/2005 | Basol |
| 2006/0037855 | A1 | 2/2006 | Hanson et al. |
| 2006/0175202 | A1 | 8/2006 | Mazur |
| 2006/0260952 | A1 | 11/2006 | Mazur |
| 2007/0051619 | A1 | 3/2007 | Mazur |
| 2007/0051639 | A1 | 3/2007 | Mazur |
| 2007/0094928 | A1 | 5/2007 | Hunter |
| 2007/0131561 | A1 | 6/2007 | Wang et al. |
| 2007/0212281 | A1 | 9/2007 | Kadlee et al. |
| 2007/0292314 | A1 | 12/2007 | Effenhauser et al. |
| 2008/0015531 | A1 | 1/2008 | Hird et al. |
| 2009/0277867 | A1 | 11/2009 | Mayer et al. |
| 2009/0280649 | A1 | 11/2009 | Mayer et al. |

OTHER PUBLICATIONS

Eisner, S., "Electroplating Accompanied by Controlled Abrasion of the Plate", Oct. 1971, pp. 993-996.

Notification of ownership transfer of certain patents owned by NuTool, Inc., 2007.

Osterwald et al., "New Theoretical Ideas about the Action of Bath Additives During Cathodic Deposition", Galvanotechnik, vol. 66 (1975), No. 5, pp. 360-365.

Osterwald, Jorg, "Leveling and Roughening by Inhibitors and Catalyst", Institute for Metallurgy of the Technical University of Berlin, vol. 17, No. 5, 1976, pp. 89-94.

Patton et al., "Sequential Station Tool for Wet Processing of Semiconductor Wafers", Novellus Systems, Inc., U.S. Appl. No. 10/693,223, filed Oct. 24, 2003, pp. 1-32.

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

U.S. Office Action for U.S. Appl. No. 10/739,822 mailed May 17, 2007.

U.S. Final Office Action for U.S. Appl. No. 10/739,822 mailed Nov. 27, 2007.

Notice of Allowance, mailed Jul. 10, 2008 and Allowed Claims for U.S. Appl. No. 10/739,822.

U.S. Office Action for U.S. Appl. No. 11/065,708 mailed Dec. 12, 2007.

Office Action as mailed on Jun. 13, 2008 for U.S. Appl. No. 11/065,708.

U.S. Final Office Action for U.S. Appl. No. 11/065,708 mailed Nov. 12, 2008.

Notice of Allowance for U.S. Appl. No. 11/065,708 mailed Mar. 3, 2009.

Office Action mailed Jul. 9, 2010 for U.S. Appl. No. 11/888,318.

U.S. Final Office Action for U.S. Appl. No. 11/888,318 mailed Feb. 3, 2011.

Notice of Allowance mailed May 20, 2010 and Allowed Claims for U.S. Appl. No. 11/544,957.

U.S. Office Action, mailed Nov. 2, 2007 for U.S. Appl. No. 10/824,069.

Notice of Allowance, mailed May 15, 2008 for U.S. Appl. No. 10/824,069.

Final Office Action mailed Oct. 20, 2010 for U.S. Appl. No. 11/602,128.

U.S. Office Action for U.S. Appl. No. 11/890,790 mailed Dec. 27, 2010.

Silva, "Applied Hydrology to Fluidic Devices", email message received May 11, 2010, 7 pgs.

Mayer et al., "Topography Reduction and Control by Selective Accelerator Removal" Novellus Systems, Inc., U.S. Appl. No. 11/602,128, filed Nov. 20, 2006.

Mayer et al., "Method for Planar Electroplating", Novellus Systems, Inc., U.S. Appl. No. 11/888,318, filed Jul. 30, 2007.

Mayer et al., "Selective Electrochemical Accelerator Removal" Novellus Systems, Inc., U.S. Appl. No. 12/860,787, filed Aug. 20, 2010.

* cited by examiner

METHODS AND APPARATUS FOR DEPOSITING COPPER ON TUNGSTEN

FIELD OF INVENTION

The invention generally relates to electroplating technology. More specifically the invention finds application in the semiconductor industry. Even more specifically the invention relates to technology for electroplating copper onto tungsten, with particular use for electroplating copper onto tungsten for seed and bulk electrofill e.g. for Damascene and TSV applications.

BACKGROUND

Damascene processing is a method for forming metal lines on integrated circuits. It is often a preferred method because it requires fewer processing steps than other methods and offers a higher yield. Through silicon vias (TSVs) are sometimes used in conjunction with Damascene processing to create 3D packages and 3D integrated circuits (IC), by providing interconnection of vertically aligned electronic devices through internal wiring that significantly reduces complexity and overall dimensions of a multi-chip electronic circuit.

Conductive routes on the surface of a circuit formed during Damascene processing or in TSVs are commonly filled with copper. Unfortunately, copper presents special challenges because it readily diffuses into silicon oxide and thus reduces silicon's electrical resistance even at very low doping levels. Therefore in typical Damascene or TSV processing a conformal diffusion barrier layer is first deposited on silicon surfaces followed by a conductive seed copper layer on the diffusion barrier to aid subsequent electroplating of a copper fill layer that fills the trenches, vias and holes.

This process presents certain challenges, one of which is the relatively high cost of materials.

SUMMARY

In one sense, the invention provides improved methods and apparatus for electroplating copper onto tungsten. Aspects of the invention find particular use in electroplating copper seed layers onto tungsten diffusion barrier layers on semiconductor wafers. Since tungsten is a good barrier layer material and electroplating processes can typically deposit very thin conformal films, the invention addresses the conflict between excessive field thickness and inadequate sidewall coverage obtained with films laid using PVD.

One aspect of the invention is a semiconductor processing method for depositing copper including: (i) providing a semiconductor wafer having a tungsten layer thereon; (ii) exposing the tungsten layer to an acidic medium, the acidic medium substantially free of copper ions; (iii) applying a negative current density to the tungsten layer; (iii) introducing copper ions to the acidic medium; and (iv) electroplating a copper layer onto the tungsten layer. In one embodiment, the copper layer is a seed layer. In another embodiment, copper deposition is continued to form a bulk copper layer. Pretreating the tungsten layer with an acidic medium, and then applying a negative current density to the tungsten layer, prepares the tungsten layer for copper electrodeposition with good adherence.

Typically, but not necessarily, the acidic medium is degassed to aid electroplating. For example, the acidic medium is deoxygenated to avoid reoxidation of the tungsten layer prior to seed deposition or degassed to removed hydrogen which can form in the electrolytic process and interfere with conformal copper plating. The acidic medium is, typically but not necessarily, a low-pH aqueous medium. Mineral acids are particularly useful as reagents to prepare the acidic medium. Sulfuric acid works well, and one suitable concentration range is between about 0.5 M to about 5 M. Copper sulfate works well as a copper ion source as it shares the same counter ion as sulfuric acid. In some embodiments, a copper anode, alone or in combination with a copper ion solution, is used as a source of copper ions in the acidic medium.

In some methods of the invention, exposing the tungsten layer to the acidic medium is performed until the open current potential as measured in the tungsten layer reaches a substantially steady state. This is a convenient, but not necessary, method of determining when the tungsten layer is ready for application of the negative current density. Depending upon, e.g., the thickness of the oxides on the tungsten layer and the strength of the acidic medium, exposure to the acidic medium may take on the order of less than a minute to about 10 minutes. Typically, exposure is performed for between about 1 minute and about 5 minutes prior to application of the negative current density in the absence of copper ions for a second period.

The negative current density applied to the tungsten layer can be as low as about 1 mA/cm$^2$ and as high as about 500 mA/cm$^2$. In one embodiment, the negative current density is between about 30 mA/cm$^2$ and about 300 mA/cm$^2$ for between about 1 second and about 100 seconds. The negative current density is established by application of a negative voltage to the tungsten layer, as measured by a reference electrode, e.g. a Calomel, mercury sulfate or other suitable electrode, in the acidic medium. In one embodiment, the negative voltage applied to the tungsten layer is between about −1.0 volts to about −2.0 volts, in another embodiment between about −1.3 volts to about −1.6 volts, and in another embodiment between about −1.4 volts to about −1.5 volts.

Introducing copper ions to the acidic medium is typically achieved by at least one of the following techniques: using a copper anode and adding a solution of copper ions to the acidic medium. Either or both methods may be used, depending upon the needs of the particular deposition process. When only a solution of copper ions is employed, a "dummy" anode, e.g. platinum, is used to supply current to the electrodeposition. Typically, but not necessarily, the solution of copper ions is degassed prior to addition to the acidic medium. During degassing, oxygen is removed so that reoxidation of the tungsten does not occur. The copper ion concentration used is discussed in more detail below.

The current and time waveforms used to deposit the copper seed layer depend upon how thick one wants the seed layer, the concentration of copper ions, whether copper ions are added and/or if a copper anode is used, the acid bath constituents, etc. These parameters are discussed in the Detailed Description section below. Generally the copper seed layer is between about 1 nM and about 20 nM thick, but may be as thick as needed, e.g. up to 100 nM thick, or up to 500 nM thick. In one embodiment, the copper seed layer is between about 1 nM and about 10 nM thick, in another between about 1 nM and about 5 nM thick.

After the copper seed layer is deposited, the wafer is stored for later use or a bulk copper deposition is applied to the seed layer. In one embodiment, the seed layer is annealed after it is deposited. In another embodiment, no anneal is necessary.

Another aspect of the invention is a semiconductor processing method for depositing copper including: (i) providing a semiconductor wafer having a tungsten layer thereon; (ii) exposing the tungsten layer to an acidic medium until the open current potential as measured in the tungsten layer reaches a substantially steady state, wherein the acidic medium is substantially free of copper ions and may be degassed; (iii) applying a negative current density of between about 30 mA/cm$^2$ and about 300 mA/cm$^2$ to the tungsten layer for between about 1 second and about 100 seconds; (iii) introducing copper ions to the acidic medium by at least one of using a copper anode and adding a solution of copper ions to the acidic medium; and (iv) electroplating a copper seed layer onto the tungsten layer. In one embodiment, the acidic medium is sulfuric acid having a concentration of, e.g., about 1M. In another embodiment, where sulfuric acid is used, the solution of copper ions is a degassed copper sulfate solution.

In one embodiment, where degassed copper sulfate solutions are added to the sulfuric acid medium, electroplating the copper seed layer onto the tungsten layer includes applying a current density of between about 30 mA/cm$^2$ and about 50 mA/cm$^2$ for between about 1 second and about 10 seconds, and then applying a current density of between about 1 mA/cm$^2$ and about 10 mA/cm$^2$ for between about 100 seconds and about 240 seconds. In another embodiment, where introducing copper ions to the acidic medium is achieved only by using the copper anode, electroplating the copper seed layer onto the tungsten layer includes applying a current density of between about 100 mA/cm$^2$ and about 200 mA/cm$^2$ for between about 400 seconds and about 600 seconds. Typically, but not necessarily, the copper seed layer is between about 1 nM and about 20 nM thick.

Another aspect of the invention is a semiconductor processing apparatus for depositing copper including: (i) one or more electroplating baths; (ii) one or more robots configured to transfer a wafer to and from said one or more electroplating baths; and (iii) a controller executing a set of instructions, the instructions including: a) introducing an acidic medium substantially free of copper ions into a first electroplating bath of said one or more electroplating baths; b) introducing a wafer having a tungsten layer deposited thereon into the acidic medium; c) applying a negative current density to the tungsten layer; d) introducing copper ions into the acidic medium; and e) electroplating a copper seed layer onto the tungsten layer. In one embodiment, instructions for applying a negative current density to the tungsten layer include applying the negative current density at least until the open current potential as measured in the tungsten layer reaches a substantially steady state. In another embodiment, instructions for electroplating the copper seed layer onto the tungsten layer include applying a current density of between about 100 mA/cm$^2$ and about 300 mA/cm$^2$ for between about 300 seconds and about 600 seconds when only a copper anode is used as a source for copper ions. In another embodiment, instructions for electroplating a copper seed layer onto the tungsten layer includes applying a current density of between about 10 mA/cm$^2$ and about 60 mA/cm$^2$ for between about 1 second and about 20 seconds, and then applying a current density of between about 1 mA/cm$^2$ and about 20 mA/cm$^2$ for between about 60 seconds and about 300 seconds when the copper ion concentration in the acidic medium is between about 0.01 M and about 1M. In another embodiment, instructions for electroplating the copper seed layer onto the tungsten layer include electroplating until the copper seed layer is between about 1 nM and about 20 nM thick.

Apparatus of the invention can have instructions that further include: f) introducing an electroplating solution into a second electroplating bath of said one or more electroplating baths; g) providing the wafer having the copper seed layer to the second electroplating bath; and h) electroplating a bulk layer of copper onto the copper seed layer. In other embodiments, the set of instructions further include: f) removing the acidic medium from the first electroplating bath; g) introducing an electroplating solution into the first electroplating bath; and h) electroplating a bulk layer of copper onto the copper seed layer.

Another aspect of the invention is a semiconductor metallization stack having interconnects, including: (i) a dielectric layer; (ii) a tungsten layer deposited via, e.g., PVD, CVD, ALD and the like; and (iii) a copper seed layer deposited via electroplating, wherein the copper seed layer is between about 1 nM and about 20 nM thick. Stack devices of the invention may further including a bulk copper layer deposited on top of the copper seed layer.

These and other features and advantages of the present invention will be described in more detail below with reference to the associated drawings.

DETAILED DESCRIPTION

Figure 1:
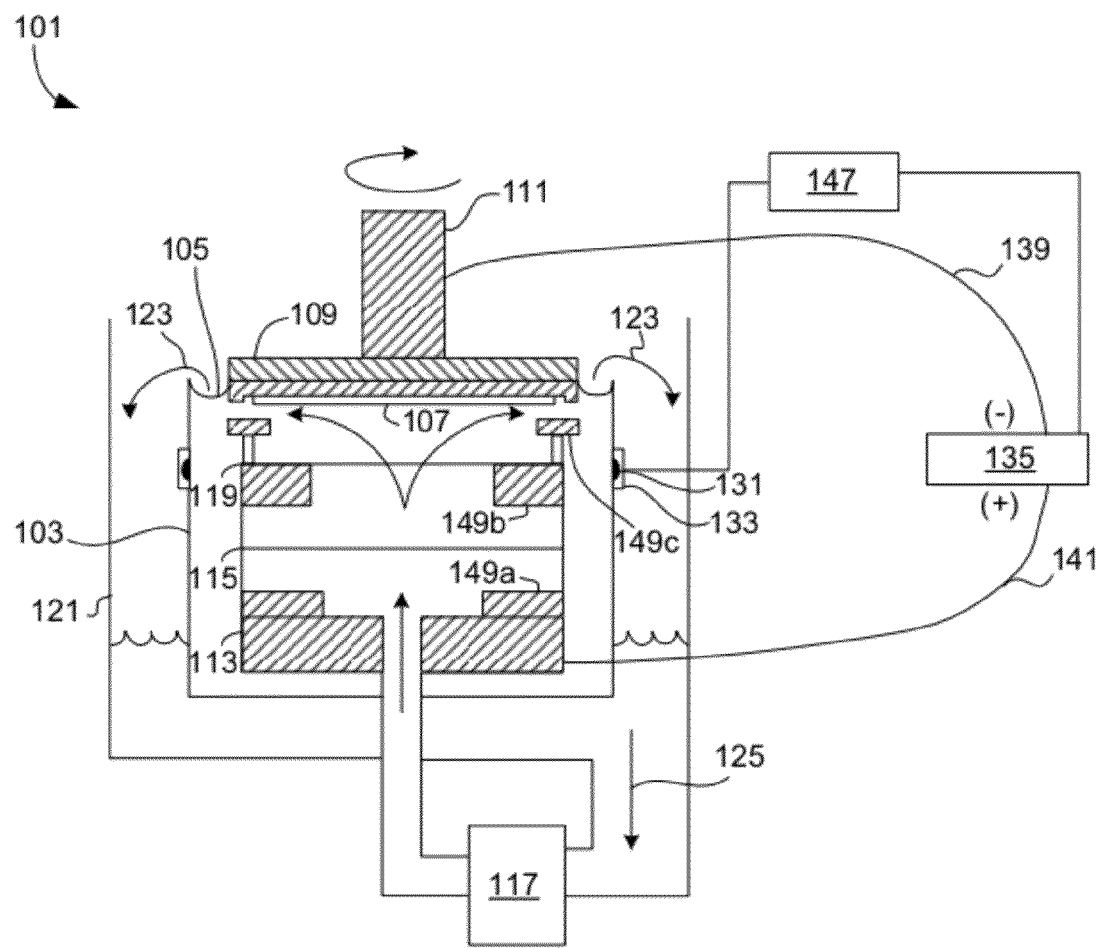
FIG. 1 is a cross section schematic of an electroplating apparatus of the invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention. For example, power supplies, valve manifolds, heaters, robots etc. as described herein can be connected to a system controller, e.g. an appropriately programmed computer, which includes program instructions for carrying out various operations such as plating, applying current, introducing a wafer into a bath, and the like, e.g. based on feedback from reference electrodes, temperature sensors, timers, flow sensors, user input and the like. One of ordinary skill in the art would appreciate that such control mechanisms are intended to be part of the invention, while not necessarily described in detail so as not to obscure the salient features of the invention.

It should be understood that diffusion barrier layers are commonly composed of materials like tantalum, tantalum nitride, tungsten, titanium, titanium tungsten, titanium nitride, and the like. Such materials provide excellent barrier properties and they are well suited for layering via plasma vapor deposition (PVD). However, barrier materials are often costly, with the exception of tungsten which is cost effective compared with other barrier materials. The deposition and chemical mechanical polishing (CMP) of tungsten can be relatively inexpensive. So, it is desirable to use tungsten as a barrier material.

When using tungsten diffusion barriers, PVD could be used to lay down the copper seed layer on top of the tungsten barrier layer. For damascene structures the use of PVD copper seed films followed by electroplating has been successful at feature dimensions as small as about 30 nm. At smaller feature dimensions, the ability to achieve continuous void-free filling with copper becomes very difficult due to excessive copper buildup on the field, which causes pinching off, or near pinch off, at feature openings and thus creates voids in the copper fill of the features.

For TSVs, the copper seed layer may be also laid down with PVD. One problem, however, is that the copper seed layer field thicknesses which are required to provide continuous copper coverage on the sidewalls of vias are typically between 500 and 2000 nm. This is much thicker than the 20-80 nm copper seed used for Damascene electroplating. The cost of the copper seed deposition increases almost linearly with thickness so the PVD seed deposition process for TSV wafers can cost over $10 per wafer. Also, chemical vapor deposition (CVD) of copper requires complex and expensive precursors.

While electroplating seed copper is cost effective, currently in the range of $1-2 per wafer, there are currently no effective methods of electroplating copper onto tungsten. Deposition of tungsten in Damascene and TSV structures is straightforward using established equipment and established or slightly modified processes, but the oxides present on the tungsten surface make electroplating adherent copper seed on the tungsten problematic. Most surface treatments of tungsten fail to reduce or remove the oxides or actually strongly attack the tungsten itself.

The inventors have recognized these shortcomings and provided methods and apparatus for electroplating adherent copper seed layers onto tungsten barrier layers. Aspects of the invention generally relate to copper electroplating methods and apparatus, more specifically depositing copper onto tungsten, more specifically depositing a copper seed layer onto a tungsten layer. Generally, but not necessarily, the tungsten layer will be a barrier layer on a silicon wafer. Tungsten is a good barrier layer to prevent copper diffusion into silicon. As mentioned, the oxides present on the tungsten surface make electroplating adherent copper seed on tungsten problematic. Most surface treatments of tungsten fail to reduce or remove the oxides or actually strongly attack the tungsten itself. Methods and apparatus of the invention for electroplating adherent copper seed layers onto tungsten barrier layers address these concerns.

FIG. 1 is a diagrammatical cross-sectional view of an electroplating apparatus, 101, that can be used to implement methods of the invention when provided with appropriate instructions as discussed in more detail below. A plating vessel, 103, contains a plating solution, which is shown at a level 105. A wafer 107 is immersed into the plating solution and is held by, e.g., a "clamshell" holding fixture, 109, mounted on a rotatable spindle, 111, which allows rotation of clamshell 109 together with wafer 107. One example of such plating apparatus that constrain electroplating solutions to the wafer active surface is the SABRE™ clamshell electroplating apparatus available from Novellus Systems, Inc. of San Jose, Calif. and described, for example, in U.S. Pat. No. 6,156,167 issued to Patton et al., and U.S. Pat. No. 6,800,187 issued to Reid et al, which are both incorporated herein by reference for all purposes.

An anode 113 is disposed below the wafer within plating bath 103 and is separated from the wafer region by an anodic membrane, 115, e.g. an ion-selective membrane. The region below the anodic membrane is often referred to as an "anode chamber." The ion-selective anode membrane 115 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes.

The plating solution is continuously provided to plating bath 103 by a pump, 117. Generally, the plating solution flows upwards through anode membrane 115 and a diffuser plate, 119, to the center of wafer 107 and then radially outward and across wafer 107. The plating solution also may be provided into the anodic region of the bath from the side of plating cell 103. The plating solution then overflows plating bath 103 to an overflow reservoir, 121, as indicated by arrows 123. The plating solution is then filtered (not shown) and returned to pump 117, as indicated by arrow 125, completing recirculation of the plating solution. In certain configurations of the plating cell, a distinct electrolyte is circulated through the portion of the plating cell in which the anode is contained and mixing with the main plating solution is prevented using sparingly permeable membranes or ion selective membranes.

A reference electrode, 131, is located on the outside of the plating vessel 103 in a separate chamber, 133; the chamber is replenished by overflow from the main plating vessel. A reference electrode is typically employed when electroplating at a controlled potential is desired. The reference electrode may be one of a variety of commonly used types such as mercury/mercury sulfate, silver chloride, saturated calomel, or copper metal. In the context of this invention, voltages applied to the wafer are expressed relative to the reference electrode.

A DC power supply, 135, can be used to control current flow to wafer 107. Power supply 135 has a negative output lead, 139, electrically connected to wafer 107 through one or more slip rings, brushes and contacts (not shown). A positive output lead, 141, of power supply 135 is electrically connected to anode 113 located in plating bath 103. Power supply 135 and reference electrode 131 can be connected to a controller, 147, which allows modulation of current and potential provided to the elements of electroplating cell. For example, the controller may allow electroplating either in galvanostatic (controlled current) or potentiostatic (controlled potential) regime. The controller may include program instructions specifying current and voltage levels that need to be applied to various elements of the plating cell, as well as times at which these levels need to be changed. For example, it may include program instructions for transitioning from depositing copper to removing copper or from potential-control to current-control upon complete immersion of the wafer into the plating bath or at some later time.

During plating, power supply 135 biases wafer 107 to have a negative potential relative to anode 113. This causes an electrical current to flow from anode 113 to wafer 107, e.g. to a seed or conductive barrier layer thereon, and an electrochemical reduction of copper ions (e.g. $Cu^{2+} + 2\ e^- \rightarrow Cu^0$) occurs on the surface of the material (the cathode) through which the current passes. This results in the deposition of a copper layer on the surfaces of the wafer. If the current flow is reversed, the reaction on the wafer surface is an oxidation (e.g. $Cu^0 \rightarrow Cu^{2+} + 2\ e^-$), which results in the removal of the copper.

Methods of the invention are described in terms of seed layer and then bulk copper deposition on the seed layer. One example of electroplating methods for depositing bulk copper fill is described in U.S. Pat. No. 6,946,065, entitled "PROCESS FOR ELECTROPLATING METAL INTO MICROSCOPIC RECESSED FEATURES," naming Steve Mayer et al. as inventors, and filed Nov. 16, 2000, which is herein incorporated by reference in its entirety. Another example of electroplating methods for depositing bulk copper fill is described in U.S. patent application Ser. No. 11/682,175, entitled "TWO STEP PROCESS FOR UNIFORM ACROSS WAFER DEPOSITION AND VOID FREE FILLING ON RUTHENIUM COATED WAFERS," naming Jonathan Reid et al. as inventors, and filed Mar. 5, 2007, which is herein incorporated by reference in its entirety.

Figure 2:
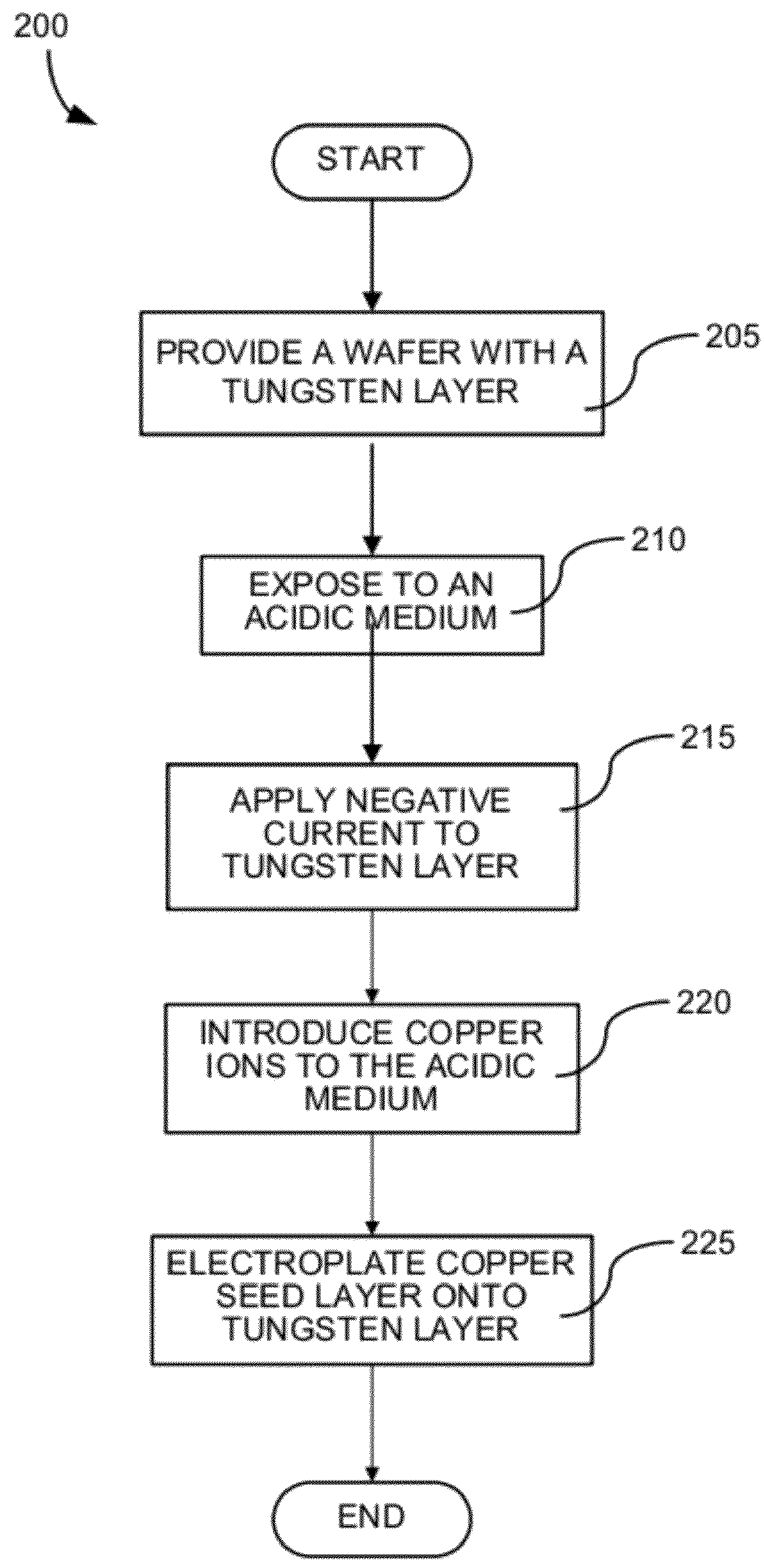
FIG. 2 is a process flow depicting aspects of a method of the invention.

As mentioned, one aspect of the invention is a semiconductor processing method for depositing copper including: (i) providing a semiconductor wafer having a tungsten layer thereon; (ii) exposing the tungsten layer to an acidic medium, the acidic medium substantially free of copper ions; (iii) applying a negative current density to the tungsten layer; (iii) introducing copper ions to the acidic medium; and (iv) electroplating a copper seed layer onto the tungsten layer. In one embodiment, the substantially copper-free acid exposure and current application to the tungsten layer substantially coincide. In another embodiment, the tungsten layer is exposed to the acidic medium for a period, and then the negative current density (and/or voltage) is applied for a period while the tungsten layer is still exposed to the substantially copper-free acidic medium. Exposure to the substantially copper-free acidic medium and application of a negative current density and/or voltage are part of a preconditioning of the invention that prepares the tungsten surface for seed layer deposition. We have found that such preconditioning provides better seed layer adherence than conventional attempts to plate copper onto tungsten. With reference to FIG. 2, each of the steps in a process flow, 200, and their interrelationships will be described in more detail below.

The Tungsten Layer

Referring to FIG. 2, the first aspect of process flow 200 is providing a wafer with a tungsten layer, see 205. The tungsten layer is typically, but not necessarily, deposited on the wafer via CVD, PVD, ALD or other suitable method known to one of ordinary skill in the art. The tungsten layer typically has tungsten oxides of various forms with metallic tungsten underneath the oxides.

In order to aid adhesion of metallic tungsten to a wafer, an adhesion layer is sometimes applied to the wafer, and then the tungsten deposited on top of the adhesion layer. The adhesion layer can also serve as a barrier layer to prevent exposure of the underlying wafer to unwanted chemistries. For example, a thin tungsten nitride layer can be deposited, e.g. via PVD, and then a thicker tungsten layer deposited on top of the tungsten nitride layer with CVD. Organometallic precursor, e.g. $WF_6$, are typically used to deposit metallic tungsten via CVD and so fluoride ion is present during deposition. The tungsten nitride adhesion layer also serves as a barrier to prevent fluoride from attacking the underlying silicon dioxide of the wafer. The adhesion/barrier layer can also be e.g. titanium or tantalum based, like titanium nitride, tantalum or tantalum nitride. For the purposes of this invention, "tungsten layer" means a metallic tungsten layer optionally including adjoining layers that are tungsten-based. In one embodiment, the tungsten layer is between about 1 nM and about 2000 nM thick. Depending upon the features to be filled the tungsten layer can be thicker, e.g. a TSV, or must be thinner for smaller features, e.g. Damascene features. In one embodiment, the tungsten layer is between about 1 nM and about 100 nM thick, in a more specific embodiment between about 3 nM and about 75 nM thick, in another embodiment between about 3 nM and about 50 nM thick. In another embodiment, the tungsten layer is between about 50 nM and about 500 nM thick, in a more specific embodiment between about 50 nM and about 200 nM thick, in another embodiment between about 50 nM and about 100 nM thick.

The Acidic Medium

Figure 3:
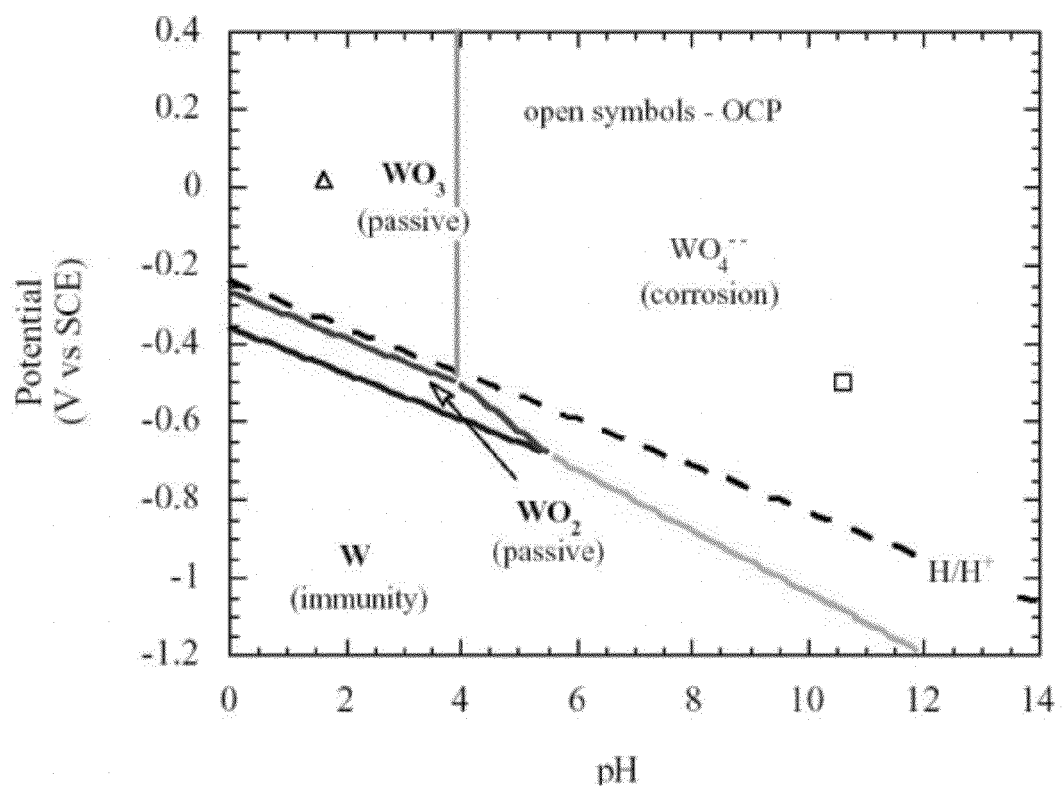
FIG. 3 is a timeline depicting aspects of methods of the invention.

Referring again to FIG. 2, the tungsten surface is exposed to an acidic medium, see 210. Referring to FIG. 3, a Pourbaix Diagram showing tungsten compositions at various pH values (x axis) with respect to applied voltage (y axis), when there is no negative voltage applied, tungsten readily exists in oxidized states. And even with applied negative voltages, at pH values higher than about 12, tungsten readily exists in oxidized forms. At pH values lower than about 12, with an applied negative voltage (or resultant current) of about −0.35 volts, tungsten exists in a zero valence metallic state.

One embodiment of the invention is a method of preconditioning a tungsten layer on a semiconductor wafer for copper seed deposition including exposing the tungsten layer to an electrolytic medium having a pH range of between 0 and about 12, and a negative voltage of between about −0.3 volts and about −2.0 volts, coincidentally, serially or with some overlap, and then introducing a source of copper ions and electroplating a copper seed layer on the tungsten layer. Although electrolytic media in the aforementioned pH range are within the scope of the invention, we have found that it is convenient to expose the tungsten layer to an acidic medium to obviate the need for application of higher voltages. In one embodiment, the pH range of the acidic medium is less than about 4. In one embodiment, the acidic medium has a pH of less than about 2. In another embodiment, the acidic medium has a pH of less than about 1. While not wishing to be bound to theory, it is believed that exposure of the tungsten layer to an acidic medium of sufficient strength removes higher oxides (and hydrates thereof) of tungsten, e.g. $W_2O_5$, $WO_3$, $WO_4^{2-}$ and the like, efficiently while allowing convenient working voltage/current ranges for preconditioning the tungsten surface.

We have found that mineral acids such as sulfuric acid, phosphoric acid, perchloric acid, hydrochloric, flouroboric acid, nitric acid, sulfonic acid and mixtures thereof, work well for the acidic medium exposure part of the preconditioning of the tungsten surface, however the invention is not limited to mineral acids. Organic acids or mixtures of organic acids and mineral acids can also be used. In one embodiment the acidic component of the acidic medium includes a mineral acid added to water. In another embodiment, there are other acidic components added, e.g., organic acids such as acetic acid, citric acid, oxalic acid, methane sulfonic acid, and the like.

One particular mineral acid that works well is sulfuric acid. It is advantageous to balance the strength of the acid with the desired result, that is, if the acid is too strong, the tungsten metal will also be removed at rates that make balancing the other factors more cumbersome, although still workable. In one embodiment, the acidic medium includes about 0.5 M to about 2 M sulfuric acid, in another embodiment about 0.75 M to about 1.5 M sulfuric acid, and in yet another embodiment the acidic medium includes about 1 M sulfuric acid. We have found that sulfuric acid in these concentration ranges works well as the basis for the acidic medium, although there may be other additives such as surfactants, reducing agents, or oxidizing agents including hydrogen peroxide.

Also, it is desirable, although not necessary, to degas (remove oxygen and/or hydrogen) the acidic medium at least during exposure of the tungsten layer and application of the negative current density. Referring again to FIG. 3, one can see that hydrogen evolution takes place at the surface of the tungsten layer (the cathode) in the aforementioned pH and voltage ranges of the tungsten metal regime. So, it is also desirable to remove the hydrogen as it is formed by degassing the acidic medium during preconditioning and electroplating the copper seed layer. Also, as mentioned it is desirable to remove oxygen so that oxidation of the tungsten layer is minimized. Degassing is typically, but not necessarily, done by passing a stream of inert gas, e.g. nitrogen or argon, through the acidic medium and/or the bulk copper plating electrolyte during the pretreatment, copper seed deposition and optional bulk copper deposition processes. Degassing can be done via vacuum, e.g. by passing the medium through a contactor that uses differential pressure across a semi-permeable membrane to remove unwanted gases. Embodiments of the invention include using inert gas, vacuum or both for degassing.

Figure 4:
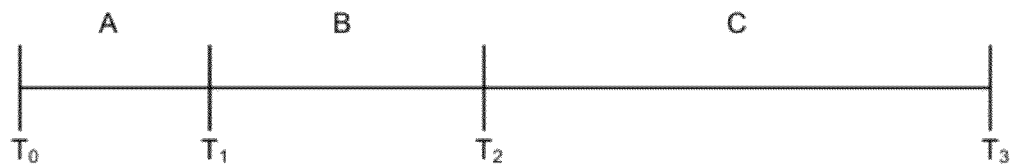
FIG. 4 is a graph showing open current potential as measured in a tungsten layer on a wafer reaching a steady state over time.

The acidic medium exposure part of the preconditioning of the tungsten layer may substantially coincide with application of the negative current density or voltage, or in other embodiments the tungsten layer is exposed to the acidic medium for a period, and then the negative current density is applied for a period. FIG. 4 shows a timeline for such an embodiment. Once the tungsten layer is exposed to the acidic medium, the timeline starts at $T_0$. Period A, from $T_0$ to $T_1$, represents the period of exposure to the acidic medium. During period A the acidic medium is substantially free of copper ions and also in period B, from $T_1$ to $T_2$, when the negative current density is applied to the tungsten layer. The copper ions are excluded so as not to plate copper onto the tungsten layer prior to the preconditioning, periods A and B. During period C, from $T_2$ to $T_3$, copper ions are introduced to allow plating on the preconditioned tungsten surface.

Figure 5:
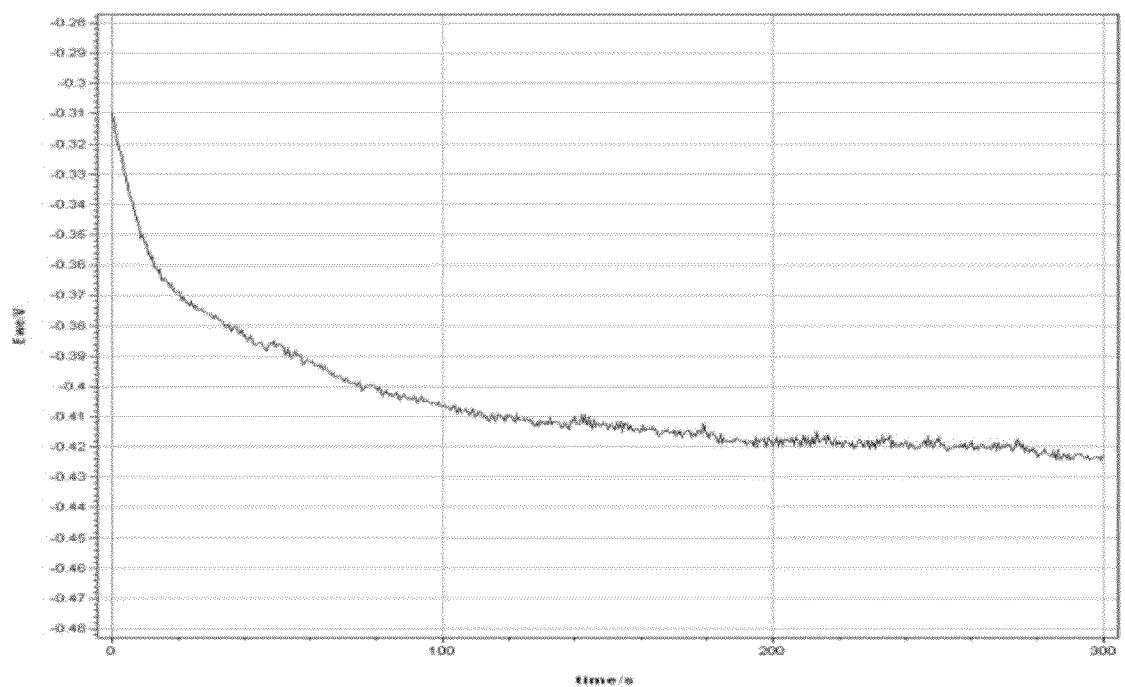
FIG. 5 is a graph showing current efficiency vs added copper ion concentration in acidic media according to one embodiment of the invention.

One particularly useful method of determining when period A is sufficient is to measure the open current potential in the tungsten layer while exposing the tungsten layer to the acidic medium. FIG. 5 shows a graph of Voltage vs. Time (in seconds) as the measured open current potential of a 200 nM thick tungsten layer exposed to 1 M sulfuric acid. The open current potential levels out after about 200 seconds in this example. Although not necessary, measuring the open current potential in the tungsten layer while exposed to the acidic medium is a convenient metric for determining when the tungsten layer's exposure to the acidic medium is sufficient so that the negative current density can be applied. In one embodiment, the exposure to the acidic medium is performed until the open current potential as measured in the tungsten layer reaches a substantially steady state. In one embodiment, exposing the tungsten layer to the acidic medium includes exposure for between about 1 minute and about 5 minutes. In another embodiment, exposing the tungsten layer to the acidic medium includes exposure for between about 3 minutes and about 5 minutes. In another embodiment exposing the tungsten layer to the acidic medium includes exposure for about 4 minutes. One embodiment includes exposing the tungsten layer to the acidic medium for any one of the above time regimes where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

The Negative Current Density and/or Voltage

Referring again to FIG. 2, once the tungsten layer is exposed to acidic medium, a negative current density (or voltage) is applied to the tungsten layer, see 215. This corresponds to period B in FIG. 4. As mentioned, the negative current density is established by application of a negative voltage to the tungsten layer, as measured by a reference electrode, e.g. a Calomel, mercury sulfate or other suitable electrode, in the acidic medium. In one embodiment, the negative voltage applied to the tungsten layer is between about −1.0 volts to about −2.0 volts, in another embodiment between about −1.3 volts to about −1.6 volts, and in another embodiment between about −1.4 volts to about −1.5 volts. A voltage is applied sufficient to cause a current flow in the tungsten layer while exposed to the acidic medium. A convenient metric for the negative voltage and/or resultant current is the current density. In one embodiment, the negative current density is between about 30 mA/cm$^2$ and about 300 mA/cm$^2$ for between about 1 second and about 100 seconds. In another embodiment, the negative current density is between about 40 mA/cm$^2$ and about 200 mA/cm$^2$ for between about 5 seconds and about 60 seconds. In yet another embodiment, the negative current density is between about 40 mA/cm$^2$ and about 150 mA/cm$^2$ for between about 10 seconds and about 30 seconds; in another embodiment between about 40 mA/cm$^2$ and about 150 mA/cm$^2$ for about 20 seconds. Exposure to the acidic medium and application of the negative voltage precondition the tungsten surface for copper seed layer deposition. One embodiment includes application of the negative voltage/current for the described time regimes where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

Copper Seed Deposition

Referring again to FIG. 2, after the tungsten layer is preconditioned, copper ions are introduced into the acidic medium, see 220. Introducing copper ions into the acidic medium can be accomplished, e.g., by adding a solution of copper ions to the acidic medium, by using a copper anode as a source of copper ions during plating or both. In one embodiment, introducing copper ions to the acidic medium is achieved by at least one of using a copper anode and adding a solution of copper ions to the acidic medium.

Figure 6:
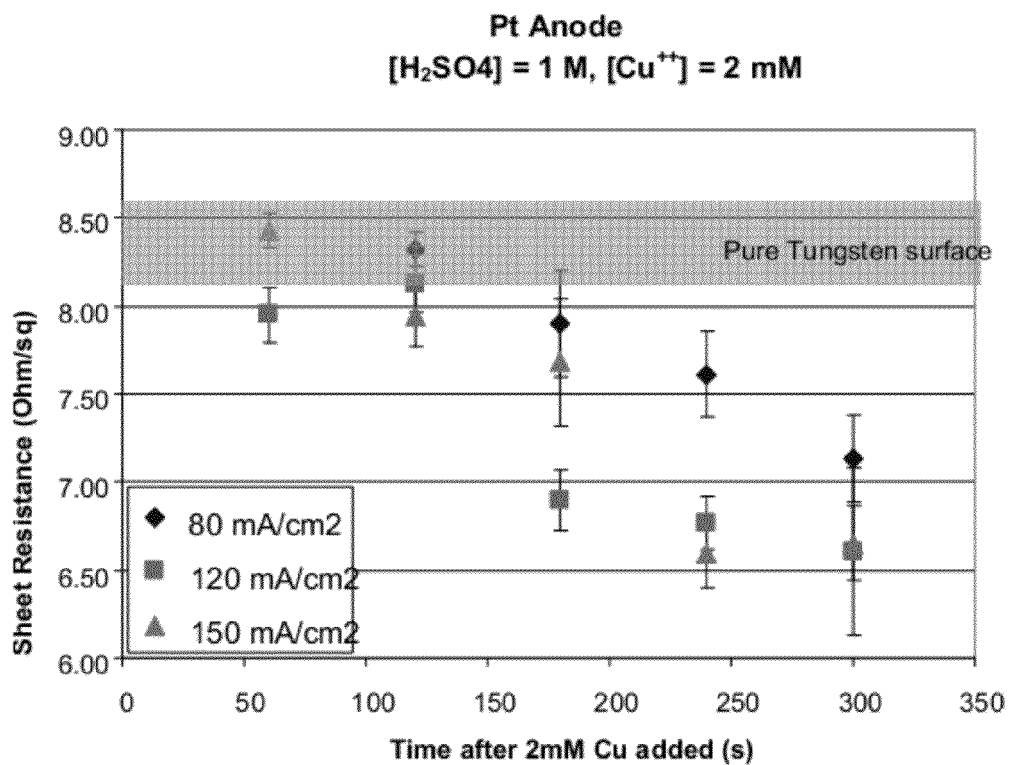
FIG. 6 shows measured sheet resistance in a copper seed layer as the layer is deposited on a tungsten layer over time where copper ions are added as a solution to acidic media.

In one embodiment, only added copper ions in solution are the source of copper ions. In a more particular embodiment, the solution of copper ions is degassed prior to addition to the acidic medium. FIG. 6 shows the effect of current density on sheet resistance for the process with copper injection (2 mM) after pretreatment of the tungsten layer in seed plating using an inert anode, in this example a platinum anode. The reduction in sheet resistance over time indicates buildup of copper on the pretreated tungsten layer. In one embodiment, electroplating the copper seed layer onto the tungsten layer includes applying a current density of between about 1 mA/cm$^2$ and about 200 mA/cm$^2$ and the solution of copper ions is added to the acidic medium to provide a copper ion concentration in the acidic medium of between about 0.001 M to about 1 M. In another embodiment, electroplating the copper seed layer onto the tungsten layer includes applying a current density of between about 2 mA/cm$^2$ and about 150 mA/cm$^2$ and the solution of copper ions is added to the acidic medium to provide a copper ion concentration in the acidic medium of between about 0.01 M to about 0.5 M. In yet another embodiment, electroplating the copper seed layer onto the tungsten layer includes applying a current density of between about 2 mA/cm$^2$ and about 40 mA/cm$^2$ and the solution of copper ions is added to the acidic medium to provide a copper ion concentration in the acidic medium of between about 0.05 M to about 0.2 M. In another embodiment, the solution of copper ions is added to the acidic medium to provide a copper ion concentration in the acidic medium of about 0.1 M. One embodiment includes electroplating the copper seed layer as described where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

Figure 7:
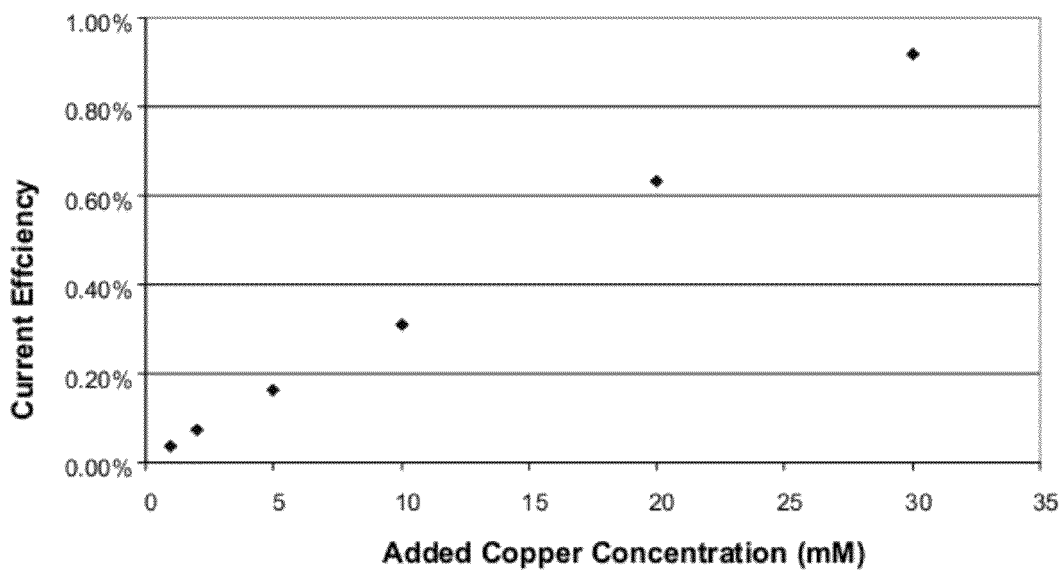
FIG. 7 shows current efficiency as a function of copper ion concentration in the acidic medium.

In another embodiment, a two step plating waveform is used to deposit the copper seed layer. This method is used to take advantage of the current efficiency which changes with copper ion concentration in the acidic medium, see FIG. 7. At higher current densities, hydrogen evolution is prevalent and can interfere with plating. Current density can be stepped down to lower values at which a higher current efficiency can be achieved in order to reduce hydrogen evolution once initial nucleation is achieved. In one embodiment, electroplating the copper seed layer onto the tungsten layer includes applying a current density of between about 10 mA/cm$^2$ and about 60 mA/cm$^2$ for between about 1 second and about 20 seconds, and then applying a current density of between about 1 mA/cm$^2$ and about 20 mA/cm$^2$ for between about 60 seconds and about 300 seconds when the copper ion concentration in the acidic medium is between about 0.01 M and about 1 M. In another embodiment, electroplating the copper seed layer onto the tungsten layer includes applying a current density of between about 30 mA/cm$^2$ and about 50 mA/cm$^2$ for between about 1 second and about 10 seconds, and then applying a current density of between about 1 mA/cm$^2$ and about 10 mA/cm$^2$ for between about 100 seconds and about 240 seconds when the copper ion concentration in the acidic medium is about 0.05 and about 0.5 M. In yet another embodiment, electroplating the copper seed layer onto the tungsten layer includes applying a current density of about 40 mA/cm$^2$ for about 2 seconds, and then applying a current density of about 2 mA/cm$^2$ for about 180 seconds when the copper ion concentration in the acidic medium is about 0.1 M. One embodiment includes electroplating the copper seed layer in any one of the two step regimes as described above where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

Figure 8:
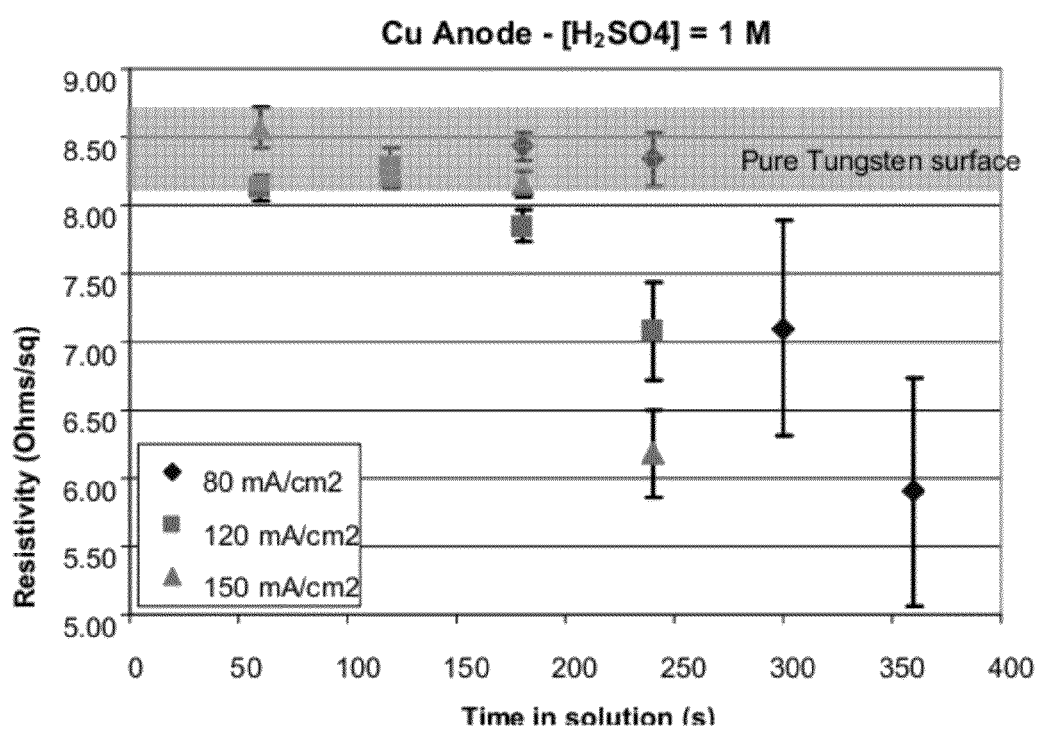
FIG. 8 shows measured sheet resistance in a copper seed layer as the layer is deposited on a tungsten layer over time where a copper anode is used as a source of copper ions for deposition of the seed layer.

In some embodiments, introducing copper ions to the acidic medium is achieved only by using the copper anode. When the copper anode is used as the only source of copper ions for plating, typically different waveforms are used in seed deposition. FIG. 8 shows the effect of current density on sheet resistance for the process with a copper anode after pretreatment of the tungsten layer in seed plating with 1 M sulfuric acid as the acidic medium. Again, the reduction in sheet resistance (relative to the tungsten layer's sheet resistance) over time indicates buildup of copper on the pretreated tungsten layer. In one embodiment using a copper anode, electroplating the copper seed layer onto the tungsten layer includes applying a current density of between about 100 mA/cm$^2$ and about 300 mA/cm$^2$ for between about 300 seconds and about 600 seconds. In another embodiment using a copper anode, electroplating the copper seed layer onto the tungsten layer includes applying a current density of between about 100 mA/cm$^2$ and about 200 mA/cm$^2$ for between about 400 seconds and about 600 seconds. In yet another embodiment using a copper anode, electroplating the copper seed layer onto the tungsten layer includes applying a current density of between about 120 mA/cm$^2$ and about 150 mA/cm$^2$ for between about 400 seconds and about 550 seconds. One embodiment includes electroplating the copper seed layer as described using only a copper anode where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

In any of the aforementioned seed plating regimens, the copper seed layer is between about 1 nM and about 200 nM thick. In another embodiment, the copper seed layer is between about 1 nM and about 20 nM thick. In another embodiment, the copper seed layer is between about 1 nM and about 10 nM thick. In another embodiment, the copper seed layer is between about 1 nM and about 5 nM thick. Referring again to FIG. 2, after the copper seed layer is electroplated on the tungsten layer, see 225, the process flow is complete.

Baths used for the seeding are typically not reused because the copper concentration in the acidic medium must be near zero at the start of the tungsten treatment, but the baths contain, e.g., up to 0.03 M copper after seeding is completed. In one embodiment, the acidic medium is reused after ion exchange and/or electrowinning treatment to remove copper ions.

Post Seed Plating

After the copper seed layer is deposited on the tungsten layer, an adherent copper layer is achieved. This copper seed layer is stable and the wafer can be stored or a bulk copper layer deposited thereon. Also, in some embodiments, an anneal is desirable. This can depend on how thick the copper seed is and/or the properties of the seed desired. In one embodiment, methods of the invention further include heating the wafer to between about 150° C. and about 500° C. after electroplating the copper seed layer, in another embodiment between about 300° C. and about 500° C. Either with or without the anneal, another method embodiment of the invention further includes electroplating a bulk copper layer onto the copper seed layer.

In methods of the invention as described, a seed layer is deposited on a tungsten layer in a first medium, typically an acidic medium, and then a bulk copper layer is deposited, typically after exchanging the first medium well suited to tungsten conditioning methods and seed deposition, followed by bulk copper deposition in a second medium, e.g. an electrolyte medium well suited for bottom up copper electrofill. The invention is not so limited. Although, depending on the acidic medium, it may be more convenient to plate a seed layer in the acidic medium, exchange the electrolyte and then plate a bulk copper layer, one of ordinary skill in the art would appreciate that one need not stop at a seed layer deposition. Employing methods of the invention, one can continue to plate beyond an amount sufficient for a seed layer to include plating a bulk layer. One embodiment of the invention is a semiconductor processing method for depositing a copper layer including: (i) providing a semiconductor wafer having a tungsten layer thereon; (ii) exposing the tungsten layer to an acidic medium, the acidic medium substantially free of copper ions; (iii) applying a negative current density to the tungsten layer; (iii) introducing copper ions to the acidic medium; and (iv) electroplating the copper layer onto the tungsten layer.

Additional Embodiments

A more specific embodiment of the invention is a semiconductor processing method for depositing copper including: (i) providing a semiconductor wafer having a tungsten layer thereon; (ii) exposing the tungsten layer to an acidic medium until the open current potential as measured in the tungsten layer reaches a substantially steady state, wherein the acidic medium is substantially free of copper ions and is degassed; (iii) applying a negative current density of between about 30 mA/cm$^2$ and about 300 mA/cm$^2$ to the tungsten layer for between about 1 second and about 100 seconds; (iii) introducing copper ions to the acidic medium by at least one of using a copper anode and adding a solution of copper ions to the acidic medium; and (iv) electroplating a copper seed layer onto the tungsten layer. One embodiment includes electroplating the copper seed layer as described using only a copper anode where the acidic medium includes sulfuric acid of between about 0.5 M to about 2 M concentration, in another embodiment the acidic medium includes sulfuric acid of between about 0.75 M and about 1.5 M concentration, and in another embodiment the acidic medium includes sulfuric acid of about 1 M concentration.

In another embodiment, the solution of copper ions is a degassed copper sulfate solution. In another embodiment, electroplating the copper seed layer onto the tungsten layer includes applying a current density of between about 30 mA/cm$^2$ and about 50 mA/cm$^2$ for between about 1 second and about 10 seconds, and then applying a current density of between about 1 mA/cm$^2$ and about 10 mA/cm$^2$ for between about 100 seconds and about 240 seconds. In one embodiment, the copper seed layer is between about 1 nM and about 10 nM thick.

In another embodiment, introducing copper ions to the acidic medium is achieved only by using the copper anode. In this embodiment, electroplating the copper seed layer onto the tungsten layer includes applying a current density of between about 100 mA/cm$^2$ and about 200 mA/cm$^2$ for between about 400 seconds and about 600 seconds. In one embodiment, the copper seed layer is between about 1 nM and about 10 nM thick.

Apparatus and Devices

Another aspect of the invention is a semiconductor processing apparatus for depositing copper including: (i) one or more electroplating baths; (ii) one or more robots configured to transfer a wafer to and from said one or more electroplating baths; (iii) a controller executing a set of instructions, said instructions including: a) introducing an acidic medium substantially free of copper ions into a first electroplating bath of said one or more electroplating baths; b) introducing a wafer having a tungsten layer deposited thereon into the acidic medium; c) applying a negative current density to the tungsten layer; d) introducing copper ions into the acidic medium; and e) electroplating a copper seed layer onto the tungsten layer. The Sabre™ apparatus as described above can be used for this purpose with the proper instructions and modifications.

In one embodiment, instructions for electroplating the copper seed layer onto the tungsten layer include applying a current density of between about 40 mA/cm$^2$ and about 300 mA/cm$^2$ for between about 300 seconds and about 600 seconds when only a copper anode is used as a source for copper ions. In another embodiment, instructions for electroplating a copper seed layer onto the tungsten layer includes applying a current density of between about 10 mA/cm$^2$ and about 60 mA/cm$^2$ for between about 1 second and about 20 seconds, and then applying a current density of between about 1 mA/cm$^2$ and about 20 mA/cm$^2$ for between about 60 seconds and about 300 seconds when the copper ion concentration in the acidic medium is between about 0.75 M and about 1.5 M. In yet another embodiment, instructions for electroplating the copper seed layer onto the tungsten layer include electroplating until the copper seed layer is between about 1 nM and about 20 nM thick.

In another embodiment, the set of instructions further include: f) introducing an electroplating solution into a second electroplating bath of said one or more electroplating baths; g) providing the wafer having the copper seed layer to the second electroplating bath; and h) electroplating a bulk layer of copper onto the copper seed layer. In another embodiment, the set of instructions further include: f) removing the acidic medium from the first electroplating bath; g) introducing an electroplating solution into the first electroplating bath; and h) electroplating a bulk layer of copper onto the copper seed layer.

Another aspect of the invention is a semiconductor device, more specifically a semiconductor metallization stack having interconnects, including: (i) a dielectric layer; (ii) a tungsten layer deposited via at least one of PVD, CVD and ALD; and (iii) a copper seed deposited via electroplating. In one embodiment, the copper layer is a seed layer between about 1 nM and about 20 nM thick. In another embodiment, where a copper seed layer is deposited initially, the semiconductor metallization stack further includes a bulk copper layer deposited on top of the copper seed layer.

In certain embodiments, a controller is employed to control process conditions, e.g. via the set of instructions in the apparatus. The controller typically includes one or more memory devices and one or more processors. The processor may include a CPU or computer, analog and/or digital input/output connections, stepper motor controller boards, etc. In certain embodiments, the controller controls all of the activities of the plating apparatus of the invention. The controller executes control software including sets of instructions for controlling the timing of the processing operations, flow rates, temperatures, voltages, etc. Typically, there will be a user interface associated with the controller. The user interface may include a display screen, graphical software displays of the apparatus and/or process conditions, and user input devices such as pointing devices, keyboards, touch screens, microphones, etc.

A computer program code for controlling the processing operations can be written in any conventional computer readable programming language: for example, assembly language, C, C++, Pascal, Fortran or others. Compiled object code or script is executed by the processor to perform the tasks identified in the program. The controller parameters relate to process conditions such as, for example, timing of the processing steps, flow rates and temperatures of precursors and inert gases, temperature of the substrate, pressure of the chamber and other parameters of a process. These parameters are provided to the user in the form of a recipe, and may be entered utilizing the user interface. Monitoring the process may be provided by analog and/or digital input connections of the controller.

The software may be designed or configured in many different ways. For example, various chamber component subroutines or control objects may be written to control operation of the chamber components for carrying out the inventive deposition processes. Examples of programs or sections of programs for this purpose include substrate timing of the processing steps code, flow rates, voltages and temperatures of electrolyts, reagents and inert gases code and the like.

EXPERIMENTAL

Figure 9:
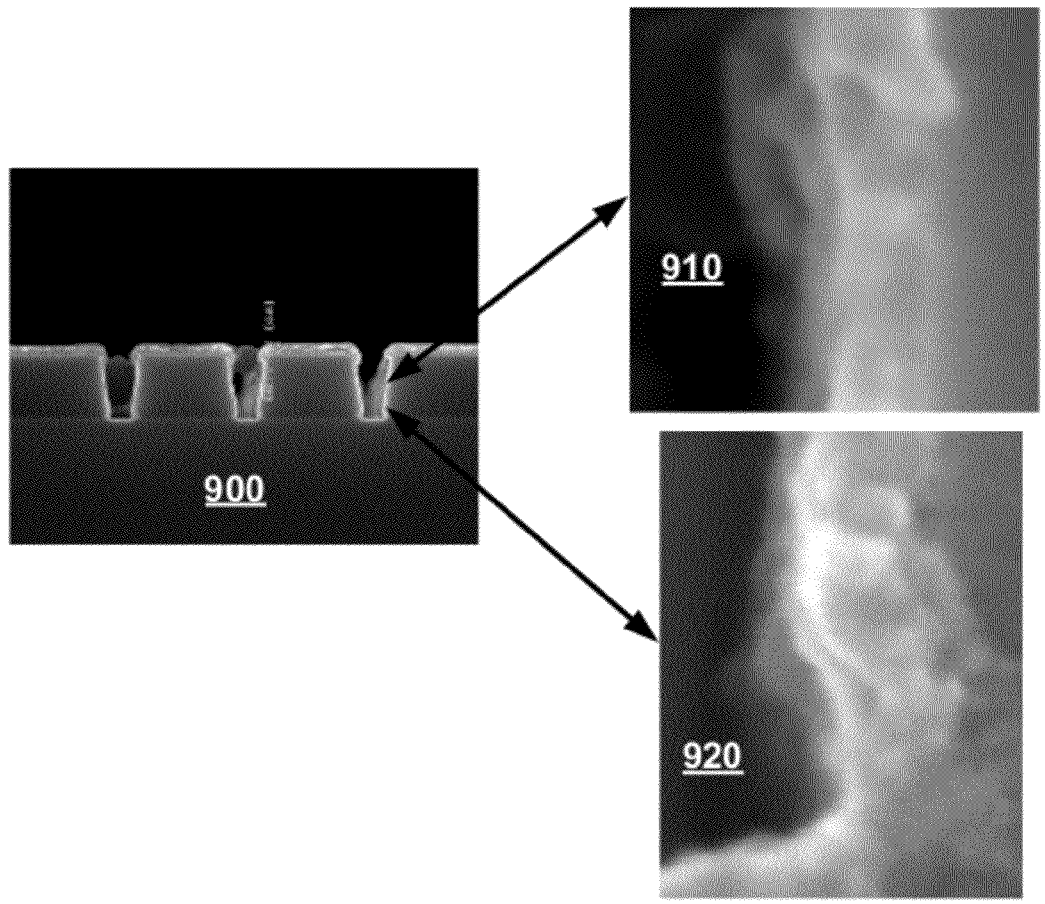
FIG. 9 shows a copper seed layer deposited using methods of the invention, and a bulk fill copper layer atop the copper seed layer.
Figure 9:
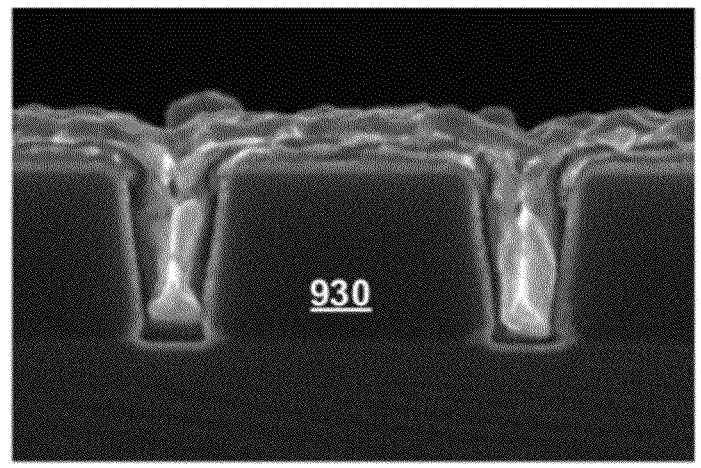

FIG. 9 shows cleave/SEM images of 0.2×0.5 micron damascene features initially coated with 20 nM tungsten, seeded with copper and then bulk filled (bottom SEM). Images of the copper seed coverage before filling are shown, see 900, and indicate seed thickness in the feature varied between about 3 nM on the sidewall, see 910, and about 7 nM on the bottom, see 920. The filled features are shown as well, see 940.

In this example, the substrate with the tungsten layer was placed in degassed 1 M sulfuric acid for 4 minutes at room temperature. A current density of 80 mA/cm$^2$ is applied to the tungsten layer for about 15 seconds. With the current still applied, copper ions are introduced by adding a degassed copper sulfate solution to make a final copper ion concentration of 0.1 M. The current density was maintained at 80 mA/cm$^2$ for another 15 seconds. The current is ceased and the wafer transferred to a bulk fill copper electrolyte bath containing 10 g/L sulfuric acid, 40 g/L cupric ion added as copper sulfate, 50 mg/L chloride ion, and 9 ml/L, 2 ml/L, and 3 ml/L respectively of Viaform Extreme Accelerator, Suppressor, and Leveler additives and was carried out at a current density of 10 mA/cm$^2$.

Figure 10:
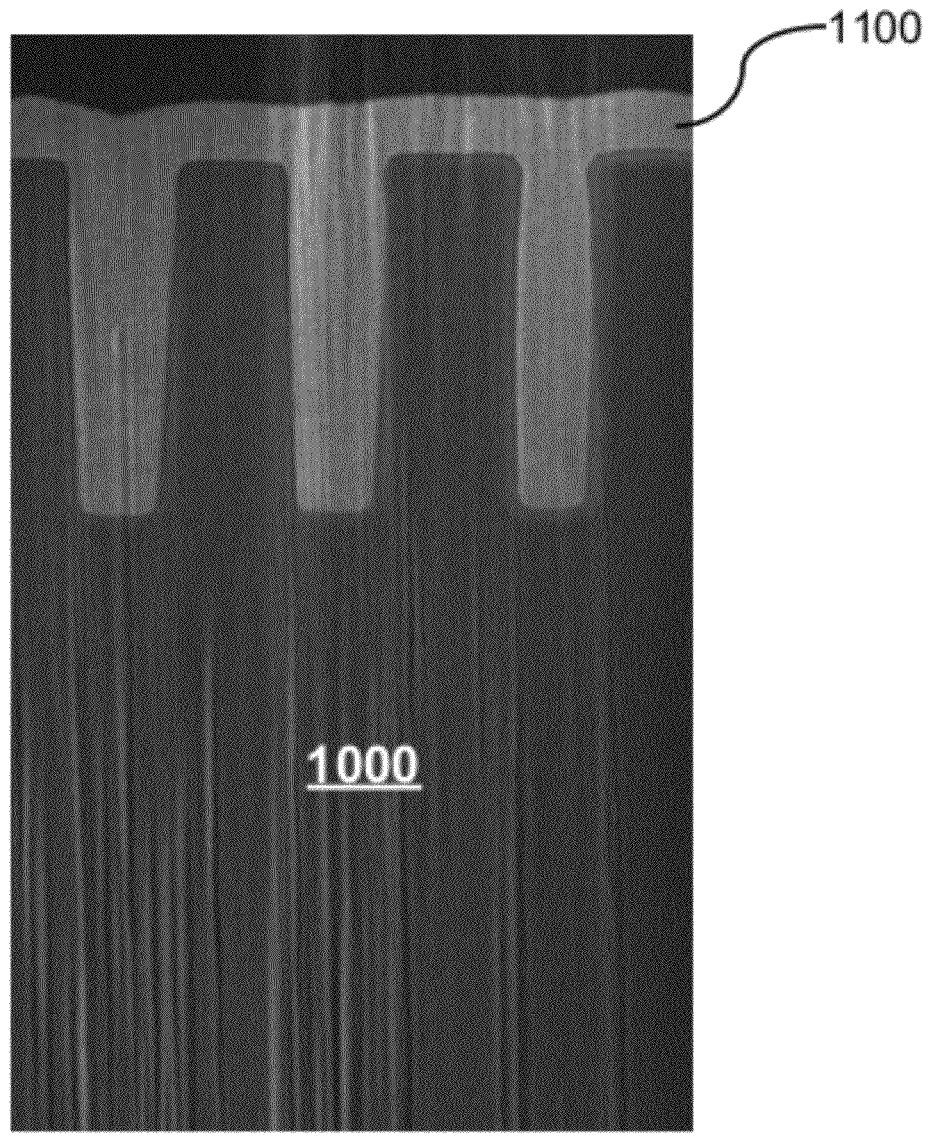
FIG. 10 shows TSV's with a copper seed layer and bulk copper layer deposited thereon according to methods of the invention.

FIG. 10 shows a SEM image of 5×20 micron TSV's following filling using the processes described herein. The TSV was initially coated with 50 nM CVD tungsten using standard processes. In this example, the wafer, 1000, was immersed in degassed 1M sulfuric acid for 4 minutes, a current of 40 mA/cm$^2$ was applied for about 20 seconds, 0.03 M cupric ion was added to the solution and a current of 40 mA/cm$^2$ was applied for 2.0 seconds and then a current of 2 mA/cm$^2$ was applied for 180 seconds to form a copper film, 1100, of approximately 100 nm in thickness on the wafer field.

While this invention has been described in terms of a few preferred embodiments, it is not limited to the specifics presented above. Many variations on the above-described preferred embodiments, may be employed. Therefore, the invention should be interpreted with reference to the following claims.

What is claimed is:

1. A semiconductor processing method for depositing copper comprising:
    providing a semiconductor wafer having a tungsten layer thereon;
    exposing the tungsten layer to an acidic medium contained in an electroplating bath, the acidic medium being substantially free of copper ions;
    applying a negative current density to the tungsten layer to form a preconditioned tungsten surface while exposing the tungsten layer to the acidic medium contained in an electroplating bath;
    introducing copper ions to the acidic medium maintained in the electroplating bath used to form the preconditioned tungsten surface; and
    electroplating a copper seed layer onto the preconditioned tungsten surface of the tungsten layer in the electroplating bath having the acidic medium containing the copper ions.

2. The method of claim 1, further comprising degassing the acidic medium at least during exposure of the tungsten layer and application of the negative current density.

3. The method of claim 2, wherein the acidic medium comprises about 0.5 M to about 2 M sulfuric acid.

4. The method of claim 2, wherein the acidic medium comprises about 1 M sulfuric acid.

5. The method of claim 3, wherein exposing the tungsten layer to the acidic medium is performed until the open current potential as measured in the tungsten layer reaches a substantially steady state.

6. The method of claim 4, wherein exposing the tungsten layer to the acidic medium comprises exposure for between about 1 minute and about 5 minutes.

7. The method of claim 6, wherein the negative current density is between about 30 mA/cm$^2$ and about 300 mA/cm$^2$ for between about 1 second and about 100 seconds.

8. The method of claim 7, wherein the negative current density is between about 40 mA/cm$^2$ and about 200 mA/cm$^2$ for between about 5 seconds and about 60 seconds.

9. The method of claim 8, wherein the negative current density is between about 40 mA/cm$^2$ and about 150 mA/cm$^2$ for between about 10 seconds and about 30 seconds.

10. The method of claim 7, wherein introducing copper ions to the acidic medium is achieved by at least one of using a copper anode and adding a solution of copper ions to the acidic medium.

11. The method of claim 10, wherein the solution of copper ions is degassed prior to addition to the acidic medium.

12. The method of claim 10, wherein introducing copper ions to the acidic medium is achieved only by using the copper anode.

13. The method of claim 11, wherein electroplating the copper seed layer onto the tungsten layer comprises applying a current density of between about 1 mA/cm$^2$ and about 200 mA/cm$^2$ and the solution of copper ions is added to the acidic medium to provide a copper ion concentration in the acidic medium of between about 0.001 M to about 1 M.

14. The method of claim 13, wherein the solution of copper ions is added to the acidic medium to provide a copper ion concentration in the acidic medium of about 0.1 M.

15. The method of claim 11, wherein electroplating the copper seed layer onto the tungsten layer comprises applying a current density of between about 10 mA/cm$^2$ and about 60 mA/cm$^2$ for between about 1 second and about 20 seconds, and then applying a current density of between about 1 mA/cm$^2$ and about 20 mA/cm$^2$ for between about 60 seconds and about 300 seconds when the copper ion concentration in the acidic medium is between about 0.01 M and about 1M.

16. The method of claim 12, wherein electroplating the copper seed layer onto the tungsten layer comprises applying a current density of between about 40 mA/cm$^2$ and about 300 mA/cm$^2$ for between about 300 seconds and about 600 seconds.

17. The method of claim 13, wherein the copper seed layer is between about 1 nM and about 20 nM thick.

18. The method of claim 15, wherein the copper seed layer is between about 1 nM and about 20 nM thick.

19. The method of claim 17, further comprising heating the wafer to between about 150° C. and about 500° C. after electroplating the copper seed layer.

20. The method of claim 17, further comprising electroplating a bulk copper layer onto the copper seed layer.

21. The method of claim 19, further comprising electroplating a bulk copper layer onto the copper seed layer.

22. The method of claim 1, wherein the copper ions are introduced into the acidic medium while the negative current density is being applied to the tungsten layer.

23. The method of claim 22, wherein the negative current density is being applied to the tungsten layer for a period of time prior to introducing the copper ions to the acidic medium.

24. The method of claim 22, wherein the negative current density is applied to the tungsten layer for a predetermined period of time after introducing the copper ions to the acidic medium.

25. The method of claim 24, wherein applying the negative current density to the tungsten layer after introducing the copper ions to the acidic medium causes electroplating the copper seed layer onto the preconditioned tungsten surface of the tungsten layer.

26. The method of claim 1, wherein the tungsten layer is exposed to the acidic medium for a predetermined period of time prior to applying the negative current density to the tungsten layer.

27. The method of claim 1, further comprising degassing the acidic medium prior to exposing the tungsten layer to the acidic medium.

28. The method of claim 1, wherein applying the negative current density to the tungsten layer comprises applying a negative voltage to the tungsten layer relative to a reference electrode provided in the acidic medium.

29. The method of claim 28, wherein the negative voltage applied to the tungsten layer is between about −1.0 volts and about −2.0 volts.

30. The method of claim 28, wherein the negative voltage applied to the tungsten layer is between about −1.4 volts and about −1.5 volts.

* * * * *